US011968808B2

(12) United States Patent
Tunks et al.

(10) Patent No.: US 11,968,808 B2
(45) Date of Patent: Apr. 23, 2024

(54) HEATER APPARATUS-INTEGRATED BEZEL FOR A COMPUTING DEVICE

(71) Applicant: Dell Products L.P., Round Rock, TX (US)

(72) Inventors: Eric Michael Tunks, Austin, TX (US); Ayedin Nikazm, Austin, TX (US); Richard Mark Eiland, Austin, TX (US); Tyler Baxter Duncan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 255 days.

(21) Appl. No.: 17/576,742

(22) Filed: Jan. 14, 2022

(65) Prior Publication Data
US 2023/0232595 A1 Jul. 20, 2023

(51) Int. Cl.
*H05K 5/00* (2006.01)
*F24H 3/02* (2022.01)
*F24H 15/204* (2022.01)
*H05K 7/20* (2006.01)

(52) U.S. Cl.
CPC .......... *H05K 7/20836* (2013.01); *F24H 3/02* (2013.01); *F24H 15/204* (2022.01)

(58) Field of Classification Search
None
See application file for complete search history.

(56) References Cited

U.S. PATENT DOCUMENTS 9,002,186 B2 * 4/2015 Akers ................ H05K 7/20145
392/432

* cited by examiner

*Primary Examiner* — Imani N Hayman
*Assistant Examiner* — Rashen E Morrison
(74) *Attorney, Agent, or Firm* — Chamberlain, Hrdlicka, White, Williams & Aughtry; Aly Z. Dossa

(57) ABSTRACT

A computing device includes a bezel and an enclosure. The bezel includes a heater apparatus. The enclosure includes a plurality of hardware components, and the bezel is affixed to a frontside of the enclosure and configured to heat at least a volume of air entering the enclosure.

20 Claims, 6 Drawing Sheets

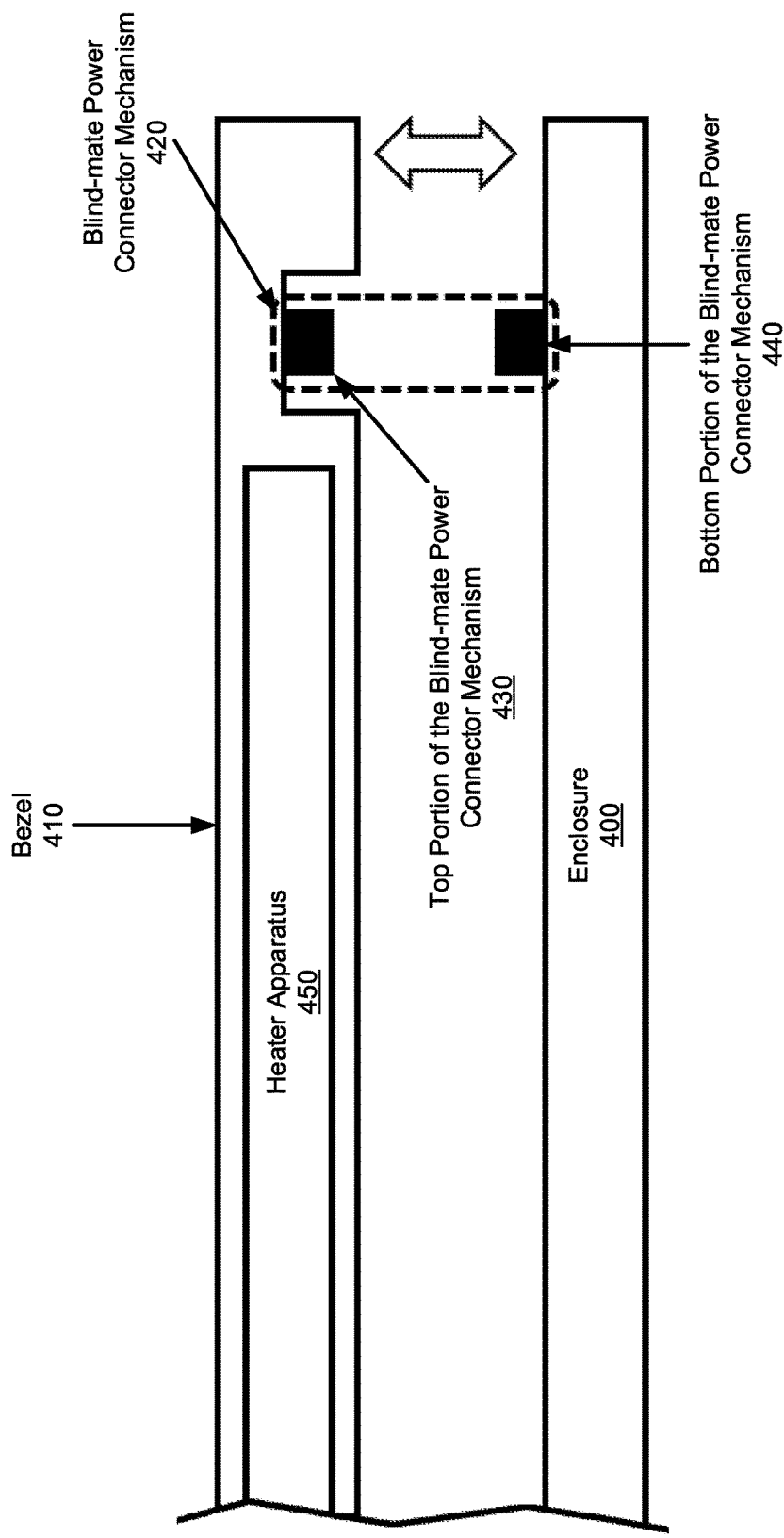
FIG. 4.1

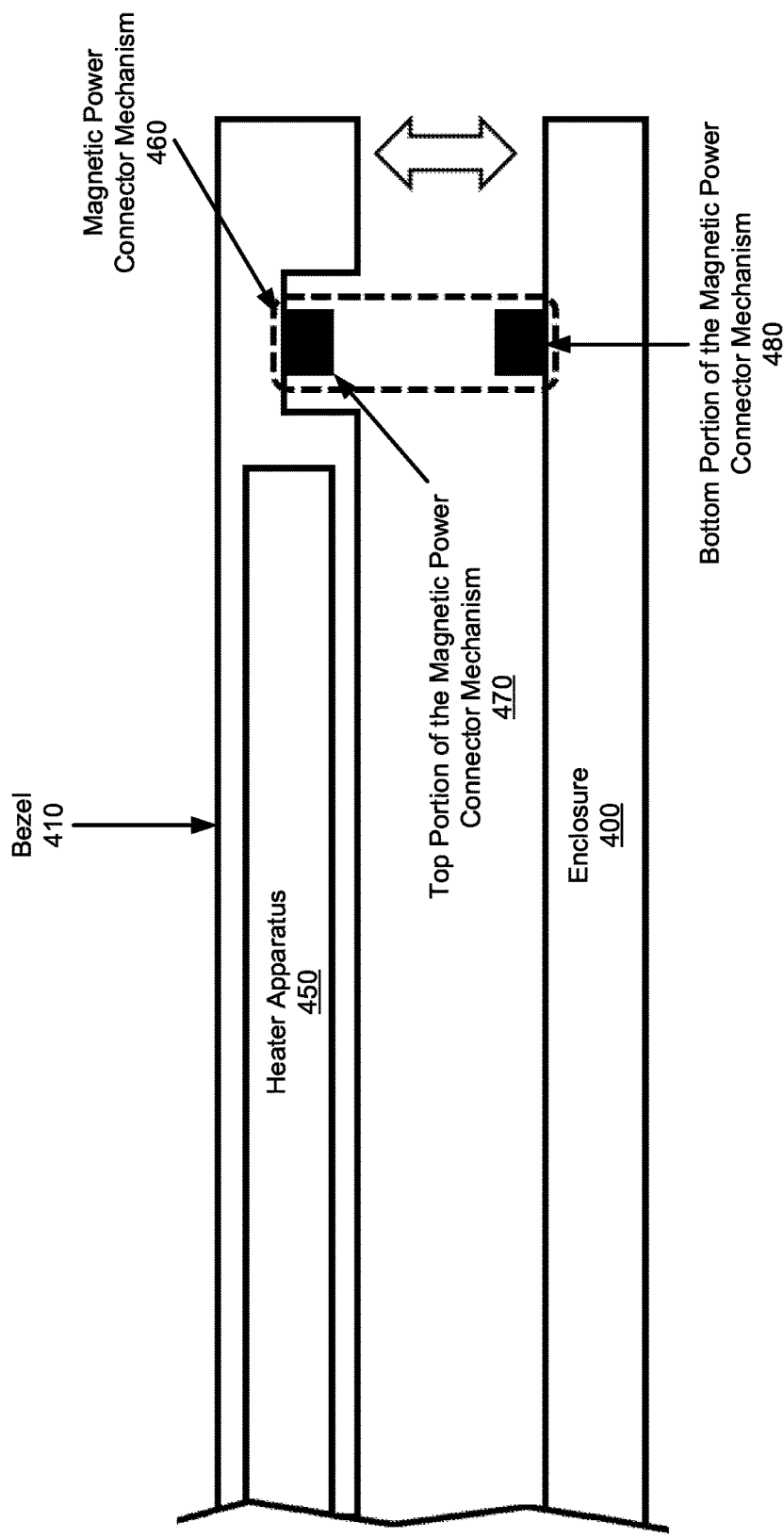
FIG. 4.2

HEATER APPARATUS-INTEGRATED BEZEL FOR A COMPUTING DEVICE

BACKGROUND

Computing devices may perform services. In order to provide the services, the computing devices may include hardware components and software components. The software components may utilize the hardware components to provide the services.

SUMMARY

In general, in one aspect, the invention relates to a computing device. The computing device includes a bezel and an enclosure. The bezel includes a heater apparatus. The enclosure includes a plurality of hardware components, and the bezel is affixed to a frontside of the enclosure and configured to heat at least a volume of air entering the enclosure.

In general, in one aspect, the invention relates to an information handling system including a cabinet housing a plurality of computing devices. Each computing device includes a bezel and an enclosure. The bezel includes a heater apparatus. The enclosure includes a plurality of hardware components, and the bezel is affixed to a frontside of the enclosure and configured to heat at least a volume of air entering the enclosure.

In general, in one aspect, the invention relates to a method for heating at least a volume of air entering a computing device. The method for heating the at least the volume of air entering the computing device may include determining a heating condition of the computing device; in response to determination, initiating heating of the at least the volume of air entering the computing device using a heater apparatus, wherein the heater apparatus includes a heater.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 4.1 shows a top-view of a portion of a computing device in accordance with one or more embodiments of the invention.

FIG. 4.2 shows a top-view of a portion of a computing device in accordance with one or more embodiments of the invention.

DETAILED DESCRIPTION

Figure 1:
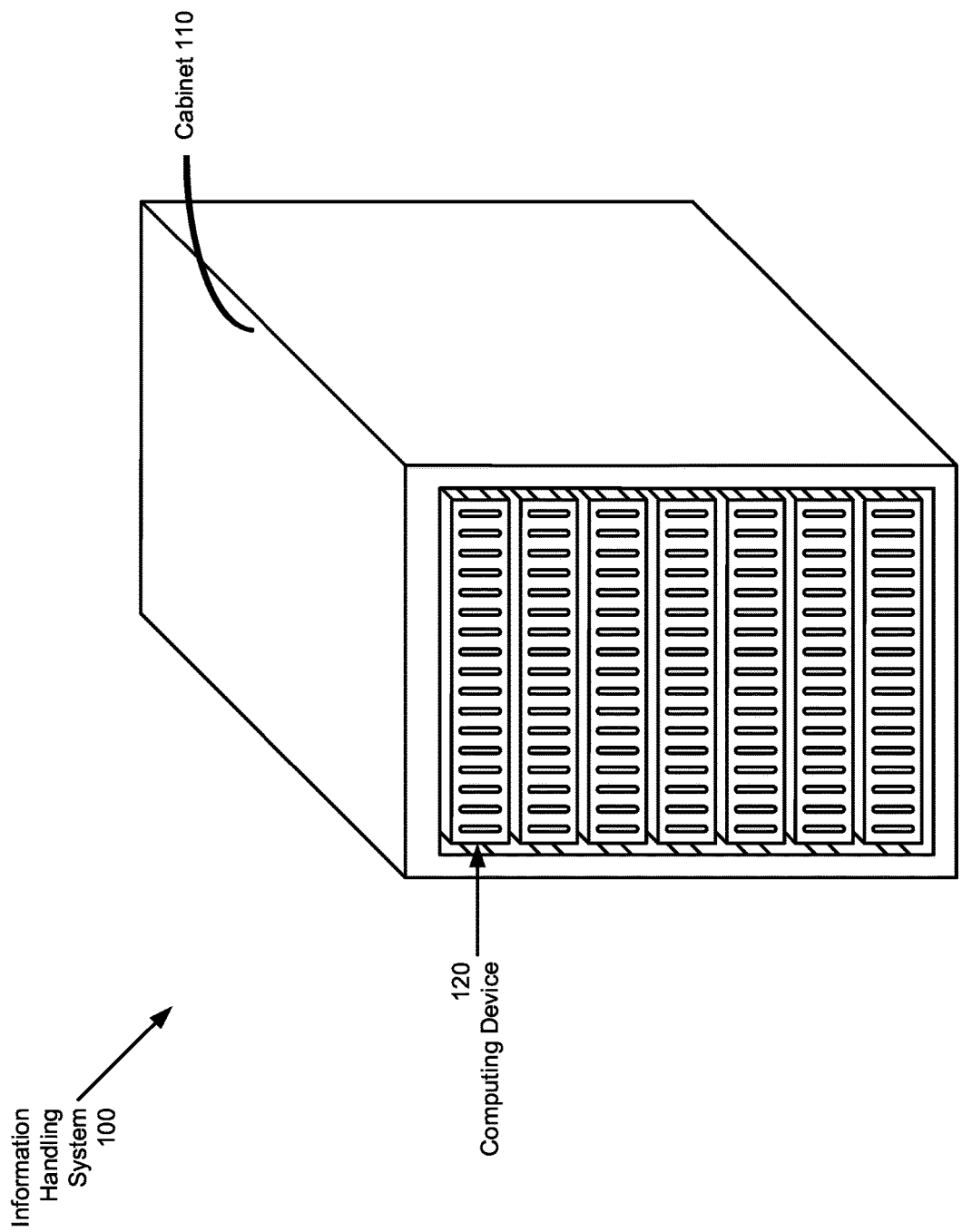
FIG. 1 shows a diagram of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information and/or power may travel may be considered an operative connection.

Computing devices may include any number of hardware components that facilitate providing the services of the computing devices. The hardware components may include, for example, processors, non-persistent storage drives, persistent storage drives, circuit cards that interconnect these components, etc. In some cases, computing devices might be deployed in environments that result in the temperature of the computing devices being outside of their designed operating range. For example, the computing devices may be designed to operate at temperatures above 0° C. When the computing devices are deployed to harsh environmental conditions (e.g., −40° C. −60° C.), the computing devices may not operate properly and, in certain scenarios, may be damaged.

To address one or more of the aforementioned issues, embodiments of the invention provide a heating mechanism to heat at least a volume of air entering a computing device. More specifically, embodiments of the invention include a bezel and an enclosure, where the bezel includes a heater apparatus. The bezel is configured to bring the hardware components to a temperature that is within their designed operating range.

Various embodiments of the computing device are described below.

FIG. 1 shows a diagram of an information handling system (100) in accordance with one or more embodiments of the invention. The system may include a cabinet (110) and any number of computing devices (e.g., 120).

The cabinet (110) may be a mechanical structure that enables computing devices (e.g., 120) to be positioned with respect to one another. For example, the cabinet (110) may be a rack mountable enclosure that enables the computing devices (e.g., 120) to be disposed within it. The cabinet (110) may be implemented as other types of structures adapted to house, position, orient, and/or otherwise physically, mechanically, electrically, and/or thermally manage the computing devices (e.g., 120). By managing the computing devices (e.g., 120), the cabinet (110) may enable multiple computing devices to be densely packed in a space without negatively impacting the operation of the information handling system (100).

A computing device (e.g., 120) may be a mechanical structure for housing components of the information handling system (100). For example, the computing device (e.g., 120) may be implemented as a rack mountable enclosure for housing components of the information handling system. The computing device (e.g., 120) may be adapted to be disposed within the cabinet (110) and/or utilize services provided by the cabinet (110) and/or other devices.

To provide services, the computing device (e.g., 120) may utilize computing device resources provided by hardware components. The hardware components may include, for example, processors, non-persistent storage drives, a printed circuited board(s), persistent storage drives, special purpose hardware, and/or other types of physical components that contribute to the operation of the computing device.

Figure 2:
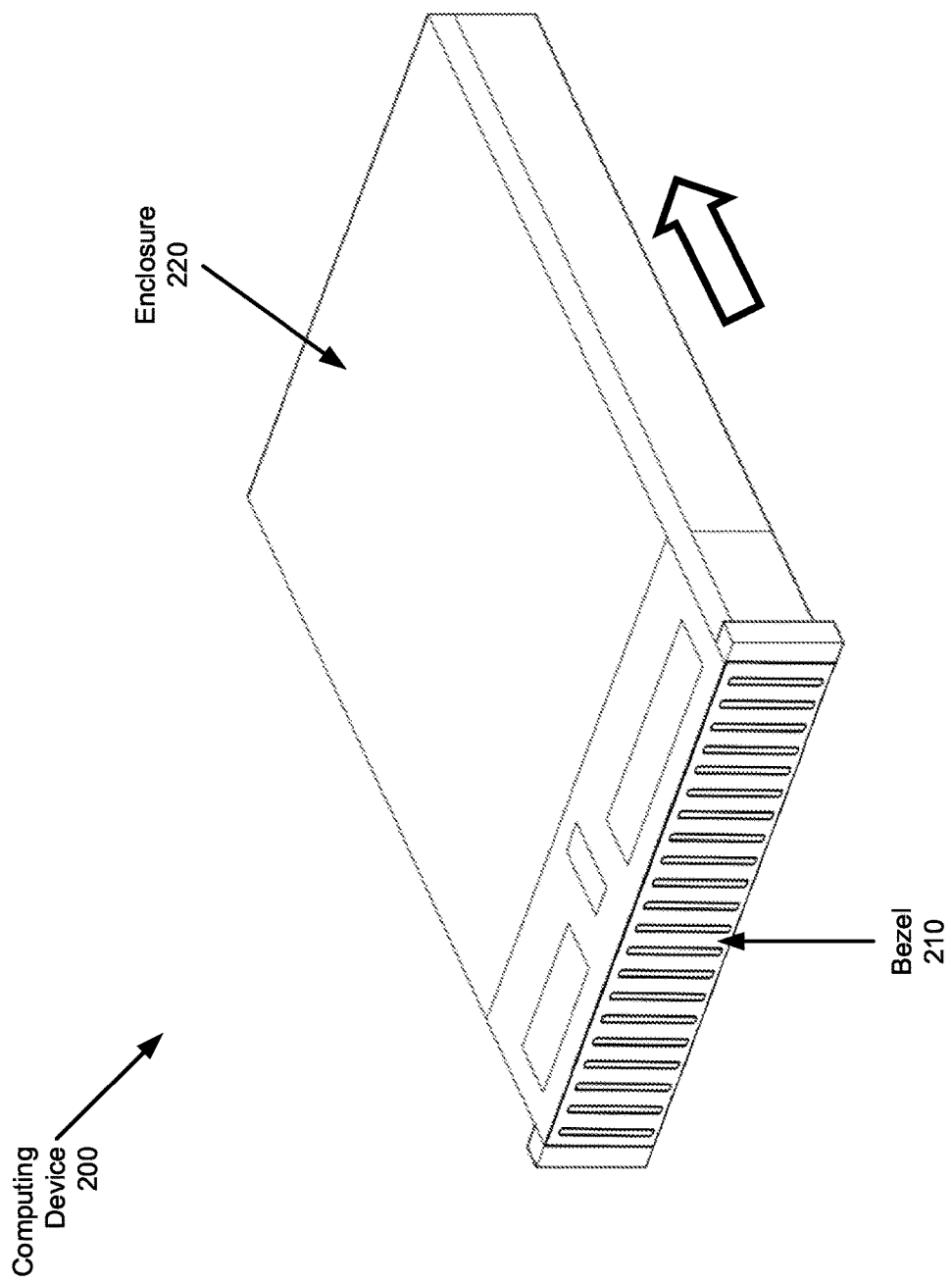
FIG. 2 shows a diagram of a computing device in accordance with one or more embodiments of the invention.

Turning now to FIG. 2, FIG. 2 shows a diagram of a computing device (200) in accordance with one or more embodiments of the invention. In one or more embodiments of the invention, the computing device includes a heater apparatus-integrated bezel (210) (also referred to as a bezel) and an enclosure (220). The enclosure includes six sides (i.e., top, bottom, right, left, front, and back), where air drawn into from the frontside of the enclosure and expelled from the backside of the enclosure (airflow direction is shown with an arrow). In general, air incoming from the frontside of the enclosure is cooler than air outgoing from the backside of the enclosure.

The heater apparatus-integrated bezel (210), which is affixed to the frontside of an enclosure (220), may improve stability and functionality of the computing device as it provides computer-implemented services in harsh environmental conditions. To provide services, the computing device (200) may utilize computing device resources provided by a number of hardware components housed within the computing device.

Figure 3:
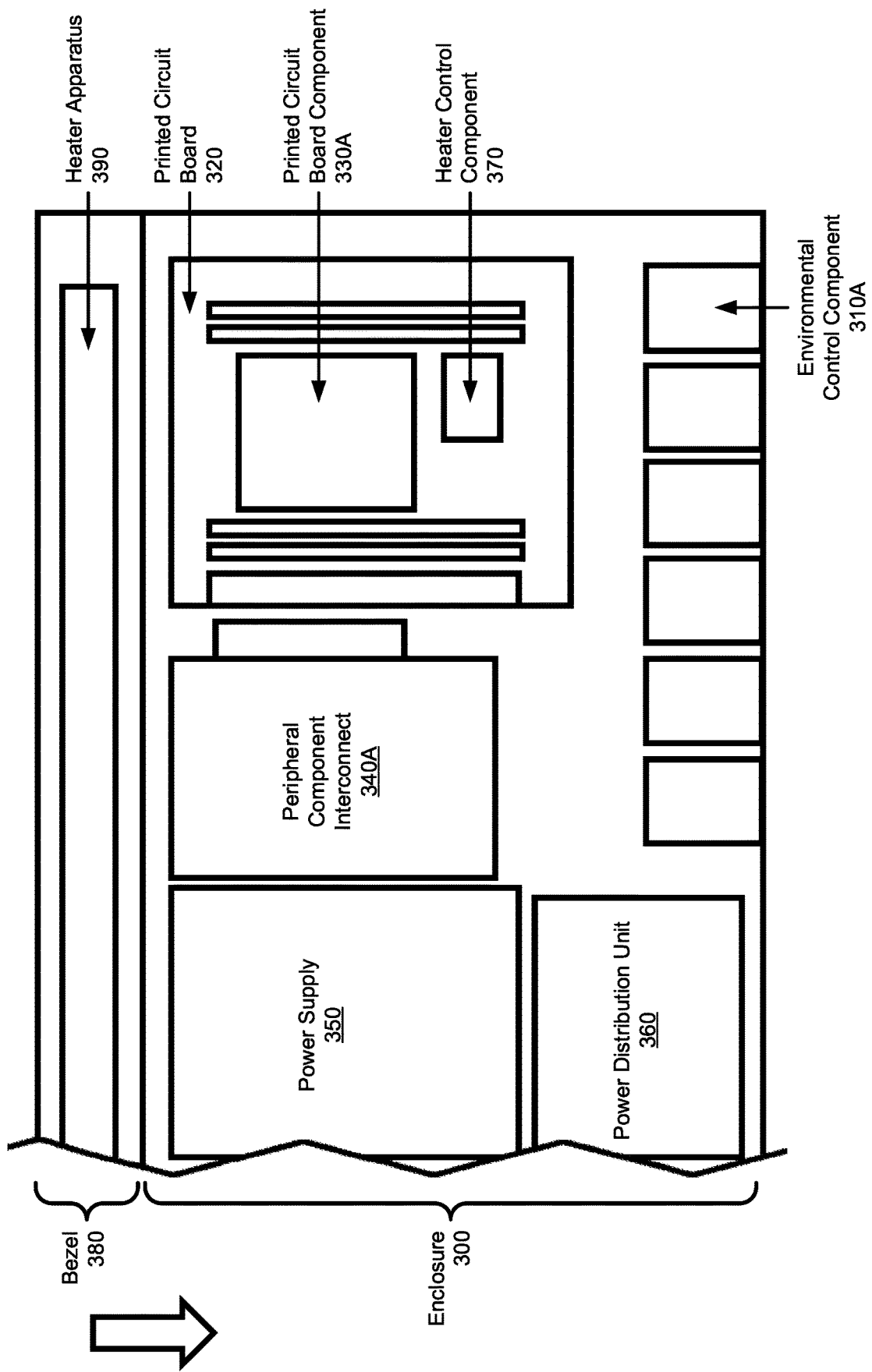
FIG. 3 shows a top-view of a portion of a computing device in accordance with one or more embodiments of the invention.

The number of hardware components may include, for example, persistent storage drives (not shown), non-persistent storage drives (not shown), processors (not shown), peripheral component interconnects (not shown), a printed circuit board (not shown), and/or other types of physical components that contribute to the operation of the computing device (200). Some examples of the hardware components are shown in FIG. 3, but the examples of the hardware components are not limited to those shown in FIG. 3. In other embodiments of the invention, one or more of the hardware components may be omitted or additional hardware components may be added based on the services provided by the computing device.

Turning now to FIG. 3, FIG. 3 shows a top-view of a portion of a computing device in accordance with one or more embodiments of the invention. In one or more embodiments of the invention, the top-view of the portion of the computing device includes an enclosure (300), a number of environmental control components (e.g., 310A), a printed circuit board (320), a number of printed circuit board components (e.g., 330A), a number of peripheral component interconnects (e.g., 340A), a power supply (350), a power distribution unit (360), a heater control component (370), a bezel (380), and a heater apparatus (390). In an embodiment of the invention shown in FIG. 3, the airflow direction is shown with an arrow.

Those skilled in the art will appreciate that while the printed circuit board (320), the number of printed circuit board components (e.g., 330A), the number of peripheral component interconnects (e.g., 340A), the power supply unit (350), and the heating and cooling control component (370) are shown that they are located at the frontside of the enclosure (300), those components may be placed at any location within the enclosure without departing from the invention. Similarly, while the number of environmental control components (e.g., 310A) and the power distribution unit (360) are shown that they are located at the backside of the enclosure (300), those components may be placed at any location within the enclosure without departing from the invention.

In one or more embodiments of the invention, the number of environmental control components (e.g., 310A) may include physical devices that provide functionality to alter characteristics (e.g., airflow directions, humidity and temperature levels, etc.) of the internal environment of the enclosure (300) at a macroscopic level. For example, the number of environmental control components (e.g., 310A) may include gas movers such as fans. The fans may be able to change a rate of gases drawn into and expelled from the enclosure.

In one or more embodiments of the invention, the heater control component (370) is configured to control the bezel (380) and it may provide heating control services. The heating control services may include, but is not limited to, (i) obtaining information regarding the temperature of one or more hardware components within the enclosure (300), where the information may be obtained through the number of temperature sensors in the enclosure (see, e.g., FIG. 5), (ii) determining a heating condition, e.g., determining whether the temperature within the enclosure is below the appropriate operating temperature range (e.g., whether the temperature is below 0° C.), (iii) initiating, based on the determination in (ii), a heating process (e.g., activating the heater apparatus in the bezel) to bring the hardware components of the enclosure into their designed operating temperature, and (iv) preventing damage (e.g., thermal runaway) to a heater in the event of overheating.

While described as a physical structure, the heater control component (370) may be implemented as a logical entity (e.g., a program executing using the number of printed circuit board components (e.g., 330A)). For example, the enclosure (300) may host a program that provides the functionality of the heater control component. Those skilled in the art will appreciate that while the heater control component (370) is shown that it is located on top of the printed circuit board (320), it may be placed at any location within the enclosure without departing from the invention.

Continuing the discussion of FIG. 3, in one or more embodiments of the invention, the bezel (380) includes the heater apparatus (390), in which the heater apparatus (390) includes a heater (not shown). In one or more embodiments of the invention, the heater apparatus (390) can also include a heat sink (not shown). When heated by the heater, the heat sink transfers thermal energy to the volume of air entering the enclosure, where the heater and the number of environmental control components (e.g., 310A) operate in coordination to draw the right amount of airflow into the enclosure.

In one or more embodiments of the invention, the heater has a number of surfaces that is heated and when air passes through them, the induced heat transferred from the heater to the volume of air drawn into the enclosure (300). In an embodiment of the invention, a number of heat sinks can be used to provide a uniform distribution of heated volume of air drawn into the enclosure through their fins, in which a bottom portion of the number of heat sinks is affixed to the heater. With this way, the surface area of the heater will be enlarged indirectly to increase the efficiency of the heater.

In one embodiment of the invention, the power supply (350) provides DC power to one or more other components in the computing device. Further, the power supply may include functionality to convert AC power (obtained from an external source) to DC power. In one embodiment of the invention, the power distribution unit (360) includes functionality to determine which hardware components receive power (i.e., power supplied by the power supply). For example, when the heater apparatus is to be activated within the bezel, the power distribution unit may be instructed (e.g., by the heater control component) to distribute power (i.e., provide power) to the heater apparatus.

FIGS. 4.1 and 4.2 show different connector mechanisms of a bezel in accordance with one or more embodiments disclosed below.

Turning now to FIG. 4.1, FIG. 4.1 shows a top-view of a portion of a computing device in accordance with one or more embodiments of the invention. In one or more embodiments of the invention, the top-view of the portion of the computing device includes an enclosure (400), a bezel (410), a heater apparatus (450), a blind-mate power connector mechanism (420, shown with a dash line), in which the blind-mate power connector mechanism (420) includes a top portion (430) and a bottom portion (440). The top portion of the blind-mate power connector mechanism (430) is operatively connected to the bezel (410) and the bottom portion of the blind-mate power connector mechanism (440) is operatively connected to the enclosure (400), where the enclosure provides the required power to the heater apparatus (450) to initiate the heating process.

Turning now to FIG. 4.2, FIG. 4.2 shows a top-view of a portion of a computing device in accordance with one or more embodiments of the invention. In another embodiment of the invention shown in FIG. 4.2, the blind-mate power connector mechanism is replaced with a magnetic power connector mechanism (460), in which the magnetic power connector mechanism (460, shown with a dash line) includes a top portion (470) and a bottom portion (480). The top portion of the magnetic power connector mechanism (470) is operatively connected to the bezel (410) and the bottom portion of the magnetic power connector mechanism (480) is operatively connected to the enclosure (400), where the enclosure provides the required power to the heater apparatus (450) to initiate the heating process.

In the embodiments shown in FIGS. 4.1 and 4.2, the double-sided arrows indicate a feature of the bezel (410), where the bezel can be dynamically installed to the enclosure (400) even after the deployment of the computing devices to the harsh environmental conditions.

While FIGS. 4.1 and 4.2 show a set of power connector mechanisms, any configuration of power connector mechanisms at any location within the enclosure may be used to provide the required power to the heater to initiate the heating process without departing from the invention. Those skilled in the art will appreciate that the heater may be supplied with power, directly or indirectly (e.g., via the heating control component, the printed circuit board, etc.), via one or more power supplies (not shown) and the power distribution unit (not shown) within the enclosure.

Figure 5:
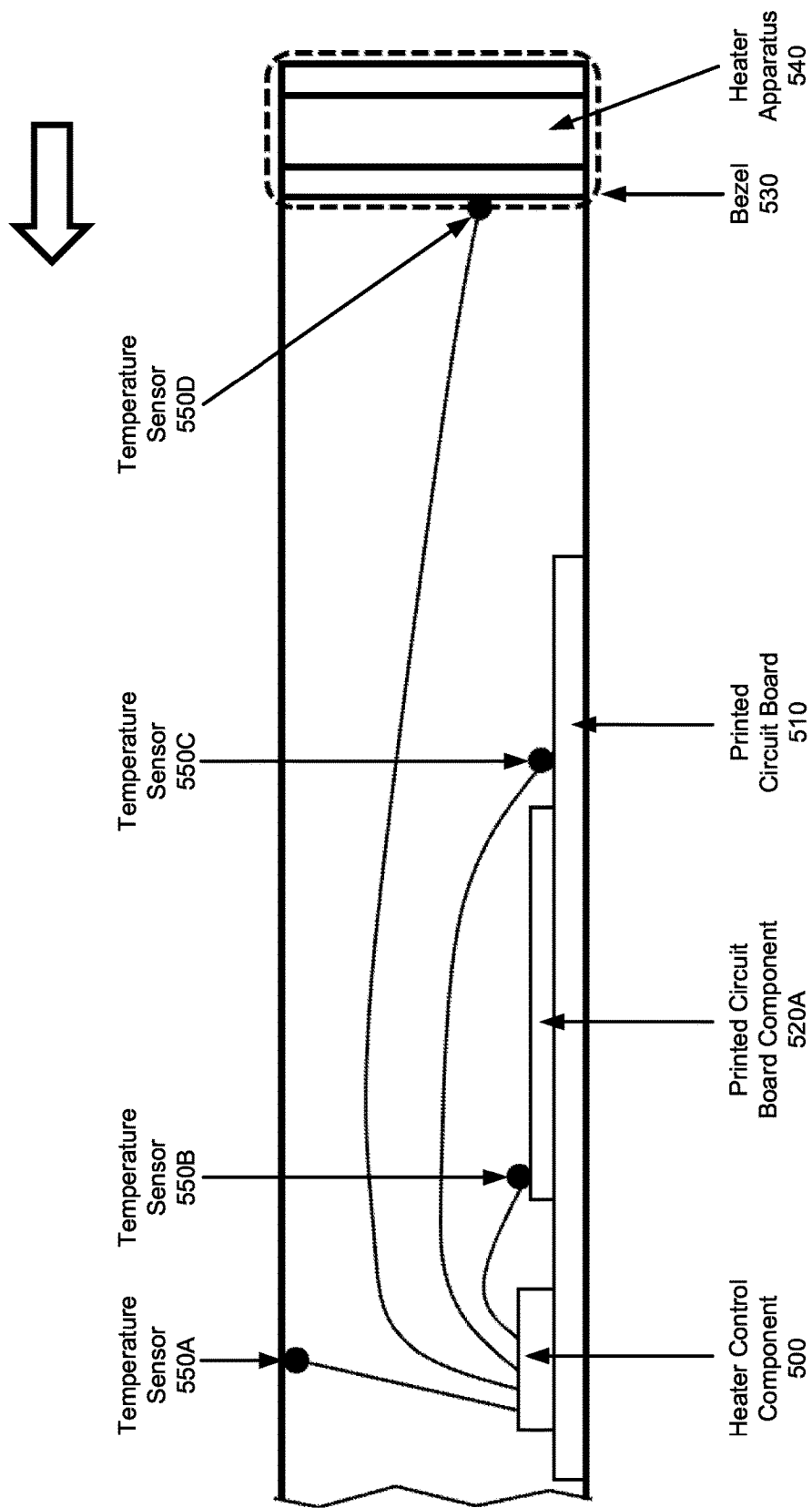
FIG. 5 shows a side-view of a portion of a computing device in accordance with one or more embodiments of the invention.

Turning now to FIG. 5, FIG. 5 shows a side-view of a portion of a computing device in accordance with one or more embodiments of the invention. In one or more embodiments of the invention, the side-view of the portion of the computing device includes a heater control component (500), a printed circuit board (510), a number of printed circuit board components (e.g., 520A), a bezel (530, shown with a dash line), a heater apparatus (540), and a temperature sensor (e.g., 550A, 550B, 550C, 550D). In an embodiment of the invention shown in FIG. 5, the airflow direction is shown with an arrow.

In one or more embodiments of the invention, one end of the temperature sensor (e.g., 550A) is operatively connected to at least one of the hardware components (e.g., printed circuit board (510)) to detect a temperature within the enclosure (e.g., 300, FIG. 3). The other end of the temperature sensor (e.g., 550A) is operatively connected to the heater control component (500), in which the heater control component is configured to control the bezel (530) based on the temperature within the enclosure (e.g., 300, FIG. 3).

In one or more embodiments of the invention, one end of the temperature sensor (e.g., 550D) is operatively connected to the bezel (530) to detect a temperature within the bezel. The other end of the temperature sensor (e.g., 550D) is operatively connected to the heater control component (500), in which the heater control component is configured to control the bezel (530) based on the temperature within the bezel.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A computing device, comprising:
a bezel, wherein the bezel comprises a heater apparatus;
an environmental control component; and
an enclosure, wherein the enclosure comprises a plurality of hardware components,
wherein the bezel is affixed to a frontside of the enclosure and configured to heat at least a volume of air entering the enclosure,
wherein the environmental control component alters a characteristic of the volume of air, wherein the characteristic of the volume of air comprises at least one selected from a group consisting of an airflow direction of the volume of air, a humidity level of the volume of air, and a temperature level of the volume of air.

2. The computing device of claim 1, wherein the heater apparatus comprises a heater.

3. The computing device of claim 2, wherein the heater apparatus comprises a heat sink, wherein the heat sink, when heated by the heater, transfers thermal energy to the volume of air entering the enclosure.

4. The computing device of claim 1, wherein a first end of a connector is affixed to the bezel and a second end of the connector is located in the enclosure, wherein the bezel receives power via the connector.

5. The computing device of claim 4, wherein the connector is a blind-mate power connector or a magnetic power connector.

6. The computing device of claim 1, further comprising:
a heater control component configured to control the bezel.

7. The computing device of claim 6, further comprising:
a temperature sensor operatively connected to the heater control component and configured to detect a temperature within the enclosure,
wherein the heater control component is configured to control the bezel based on the temperature within the enclosure.

8. The computing device of claim 6, further comprising:
a temperature sensor, located within the bezel, operatively connected to the heater control component and configured to detect a temperature within the bezel,
wherein the heater control component is configured to control the bezel based on the temperature within the bezel.

9. The computing device of claim 6, wherein the heater control component is located within the enclosure.

10. An information handling system, comprising:
a cabinet housing a plurality of computing devices;
the plurality of computing devices, wherein each of the computing devices comprises:
a bezel, wherein the bezel comprises a heater apparatus;
an environmental control component; and
an enclosure, wherein the enclosure comprises a plurality of hardware components, wherein the bezel is affixed to a frontside of the enclosure and configured to heat at least a volume of air entering the enclosure,
wherein the environmental control component alters a characteristic of the volume of air, wherein the characteristic of the volume of air comprises at least one selected from a group consisting of an airflow direction of the volume of air, a humidity level of the volume of air, and a temperature level of the volume of air.

11. The information handling system of claim 10, wherein the heater apparatus comprises a heater.

12. The information handling system of claim 11, wherein the heater apparatus comprises a heat sink, wherein the heat sink, when heated by the heater, transfers thermal energy to the volume of air entering the enclosure.

13. The information handling system of claim 10, wherein a first end of a connector is affixed to the bezel and a second end of the connector is located in the enclosure, wherein the bezel receives power via the connector.

14. The information handling system of claim 13, wherein the connector is a blind-mate power connector or a magnetic power connector.

15. The information handling system of claim 10, wherein each of the computing devices further comprises:
a heater control component configured to control the bezel.

16. The information handling system of claim 15, wherein each of the computing devices further comprises:
a temperature sensor operatively connected to the heater control component and configured to detect a temperature within the enclosure,
wherein the heater control component is configured to control the bezel based on the temperature within the enclosure.

17. The information handling system of claim 15, wherein each of the computing devices further comprises:
a temperature sensor, located within the bezel, operatively connected to the heater control component and configured to detect a temperature within the bezel,
wherein the heater control component is configured to control the bezel based on the temperature within the bezel.

18. The information handling system of claim 15, wherein the heater control component is located within the enclosure.

19. A method for heating at least a volume of air entering a computing device, comprising:
determining a heating condition of the computing device, wherein the computing device comprises at least a bezel, an environmental control component, and an enclosure, wherein the bezel comprises a heater apparatus,
wherein the bezel is affixed to a frontside of the enclosure and configured to heat at least the volume of air entering the computing device,
wherein the environmental control component alters a characteristic of the volume of air, wherein the characteristic of the volume of air comprises at least one selected from a group consisting of an airflow direction of the volume of air, a humidity level of the volume of air, and a temperature level of the volume of air; and
in response to determination, initiating heating of at least the volume of air entering the computing device using the heater apparatus, wherein the heater apparatus comprises a heater.

20. The method of claim 19, wherein the heater apparatus comprises a heat sink, wherein the heat sink, when heated by the heater, transfers thermal energy to the volume of air entering the enclosure.

* * * * *